(12) United States Patent
Mafune (10) Patent No.: US 12,142,540 B2
(45) Date of Patent: Nov. 12, 2024

(54) SEMICONDUCTOR DEVICE, POWER CONVERSION APPARATUS, AND MANUFACTURING METHOD OF SEMICONDUCTOR DEVICE

(71) Applicant: Mitsubishi Electric Corporation, Tokyo (JP)

(72) Inventor: Masayuki Mafune, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 421 days.

(21) Appl. No.: 17/494,029

(22) Filed: Oct. 5, 2021

(65) Prior Publication Data

US 2022/0301956 A1    Sep. 22, 2022

(30) Foreign Application Priority Data

Mar. 16, 2021  (JP) ................ 2021-042530

(51) Int. Cl.
*H01L 23/053* (2006.01)
*H01L 21/52* (2006.01)
(Continued)

(52) U.S. Cl.
CPC ............ *H01L 23/053* (2013.01); *H01L 21/52* (2013.01); *H01L 21/56* (2013.01); *H01L 23/10* (2013.01);
(Continued)

(58) Field of Classification Search
CPC ....... H01L 23/053; H01L 21/52; H01L 21/56; H01L 23/10; H01L 23/3121; H01L 24/48; H01L 24/73; H01L 25/072; H01L 2224/48137; H01L 2224/4846; H01L 2224/73265; H01L 2924/00014; H01L 2924/181; H01L 23/04; H01L 23/24; H01L 23/3107; H01L 23/3128; H01L 25/18; H01L 23/3675; H01L 24/32
See application file for complete search history.

(56) References Cited

U.S. PATENT DOCUMENTS

2015/0187679 A1    7/2015  Ho et al.
2018/0314097 A1*  11/2018  Kiyota ................ G02F 1/13394
(Continued)

FOREIGN PATENT DOCUMENTS

JP    H09-172102 A    6/1997
JP    2019-102575 A   6/2019
WO   2018/207279 A1  11/2018

OTHER PUBLICATIONS

An Office Action; "Notice of Reasons for Refusal," mailed by the Japanese Patent Office on Jan. 30, 2024, which corresponds to Japanese Patent Application No. 2021-042530 and is related to U.S. Appl. No. 17/494,029; with English language translation.

*Primary Examiner* — Patricia D Valenzuela
(74) *Attorney, Agent, or Firm* — Studebaker & Brackett PC (57) ABSTRACT

A semiconductor device includes: an insulating resin; a metal pattern provided on the insulating resin; a semiconductor chip jointed to the metal pattern; a case bonded on the insulating resin and surrounding the semiconductor chip; a sealing material sealing the semiconductor chip inside the case; and a cover provided on an upper part of the case and covering the semiconductor chip and the sealing material, wherein a groove having a V-shaped cross-section is provided on the cover.

14 Claims, 7 Drawing Sheets

(51) Int. Cl.
  *H01L 21/56* (2006.01)
  *H01L 23/10* (2006.01)
  *H01L 23/31* (2006.01)
  *H01L 23/00* (2006.01)
  *H01L 23/367* (2006.01)

(52) U.S. Cl.
  CPC ...... *H01L 23/3121* (2013.01); *H01L 23/3675* (2013.01); *H01L 24/32* (2013.01)

(56) References Cited

U.S. PATENT DOCUMENTS

| | | |
|---|---|---|
| 2019/0103334 A1* | 4/2019 | Tanaka .................... H01L 24/32 |
| 2019/0120456 A1* | 4/2019 | Noda ....................... F21S 41/28 |
| 2019/0164857 A1 | 5/2019 | Murata et al. |
| 2019/0393184 A1* | 12/2019 | Kondo .................. H01L 25/072 |
| 2020/0243411 A1 | 7/2020 | Hayashida |
| 2021/0407963 A1* | 12/2021 | Lin ..................... H01L 23/3675 |

* cited by examiner

SEMICONDUCTOR DEVICE, POWER CONVERSION APPARATUS, AND MANUFACTURING METHOD OF SEMICONDUCTOR DEVICE

BACKGROUND OF THE INVENTION

Field

The present disclosure relates to a semiconductor device, a power conversion apparatus, and a manufacturing method of the semiconductor device.

Background

In a power semiconductor device, a cover is fixed to an upper part of a case which stores a semiconductor chip to protect the semiconductor chip from an external environment (see, for example, WO2018/207279).

SUMMARY

A size of a case is different for each product of a semiconductor device. In related art, it is necessary to individually prepare covers in accordance with sizes of cases. It is therefore necessary to prepare a plurality of molds to mold covers, which results in a problem of high manufacturing cost.

The present disclosure has been made to solve the problem as described above and is directed to providing a semiconductor device, a power conversion apparatus, and a manufacturing method of the semiconductor device which achieve reduction in manufacturing cost.

A semiconductor device according to the present disclosure includes: an insulating resin; a metal pattern provided on the insulating resin; a semiconductor chip jointed to the metal pattern; a case bonded on the insulating resin and surrounding the semiconductor chip; a sealing material sealing the semiconductor chip inside the case; and a cover provided on an upper part of the case and covering the semiconductor chip and the sealing material, wherein a groove having a V-shaped cross-section is provided on the cover.

A manufacturing method of a semiconductor device according to the present disclosure includes: jointing a semiconductor chip to a metal pattern on an insulating resin; bonding a case to the insulating resin so as to surround the semiconductor chip; injecting a sealing material inside the case to seal the semiconductor chip; dividing a cover, on which a groove having a V-shaped cross-section is provided, along the groove in accordance with a size of the case; and placing the divided cover on an upper part of the case to cover the semiconductor chip and the sealing material.

In the present disclosure, the V-shaped groove is provided on the cover. By dividing the cover along the grooves, it is possible to easily adjust the size of the cover in accordance with sizes in a planar direction of the cases of semiconductor devices having different specifications or sizes. Thus, a shape of the cover to be molded is standardized, which eliminates the need for design of molds for a number of types of covers having different sizes, inventory control of a number of types of covers, and resin molding for each types of covers. It is therefore possible to reduce manufacturing cost.

Other and further objects, features and advantages of the invention will appear more fully from the following description.

DESCRIPTION OF EMBODIMENTS

A semiconductor device, a power conversion apparatus, and a manufacturing method of the semiconductor device according to the embodiments of the present disclosure will be described with reference to the drawings. The same components will be denoted by the same symbols, and the repeated description thereof may be omitted.

First Embodiment

Figure 1:
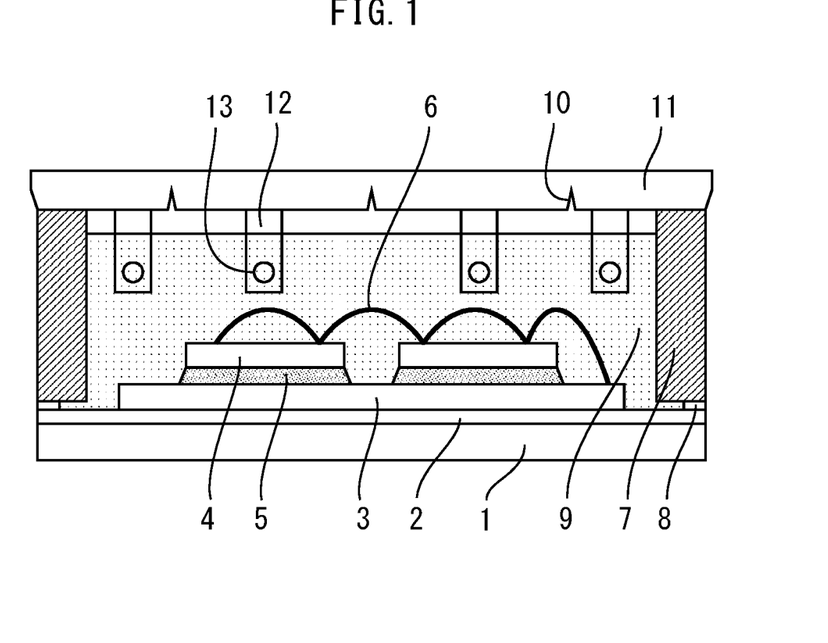
FIG. 1 is a cross-sectional view illustrating a semiconductor device according to the first embodiment.

FIG. 1 is a cross-sectional view illustrating a semiconductor device according to the first embodiment. A base plate 1 is formed with copper or aluminum having high thermal conductivity. An insulating resin 2 formed with a resin such as epoxy is provided on the base plate 1. A metal pattern 3 which constitutes a circuit is provided on the insulating resin 2. A lower electrode of a semiconductor chip 4 is jointed to the metal pattern 3 with a jointing material 5. A wire 6 is wire-bonded to an upper electrode of the semiconductor chip 4. A case 7 formed with a PPS or PBT resin is bonded on an upper surface of the insulating resin 2 with an adhesive agent 8 containing silicone as a main component so as to surround the metal pattern 3, the semiconductor chip 4 and the wire 6. Note that a control substrate may be incorporated in the case 7. The case 7 may be bonded to the base plate 1.

A sealing material 9 seals the metal pattern 3, the semiconductor chip 4, and the wire 6 inside the case 7. The sealing material 9 includes a thermosetting resin such as an epoxy resin, a phenol resin, or a polyimide resin and has insulation property, heat resistance, and adhesiveness.

Grooves 10 having V-shaped cross-sections are provided on a lower surface of a plate-shaped cover 11. The cover 11 is divided along the groove 10 in accordance with the size of the case 7 and used. The cover 11 is divided by a load being applied, and thus, a depth of the groove 10 is set equal to or greater than ⅓ of a thickness of the cover 11, and an angle of a V shape is set equal to or less than 90°. Note that the groove 10 may be provided on an upper surface of the cover 11.

Projections 12 formed with a PPS or PBT resin are provided on the lower surface of the cover 11. A tip end portion of the projection 12 is sealed with the sealing material 9. A through-hole 13 is provided at the tip end portion of the projection 12. The through-hole 13 is embedded by the sealing material 9 to exert an anchor effect. A shape of the through-hole 13 is not limited to a circle and may be other shapes such as a rectangle and a constriction if the anchor effect can be obtained.

Figure 2:
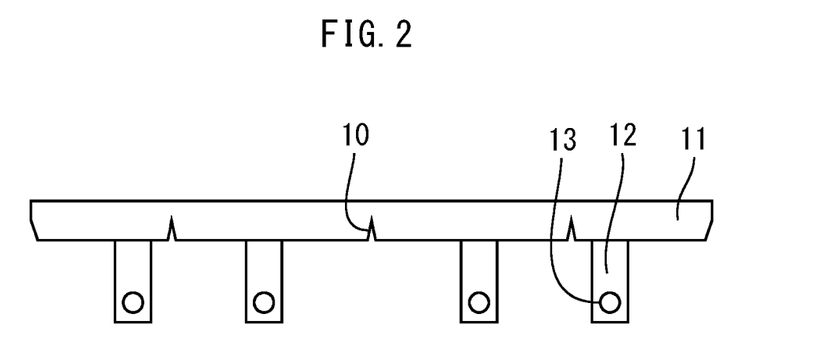
FIG. 2 is a cross-sectional view illustrating the cover according to the first embodiment.
Figure 3:
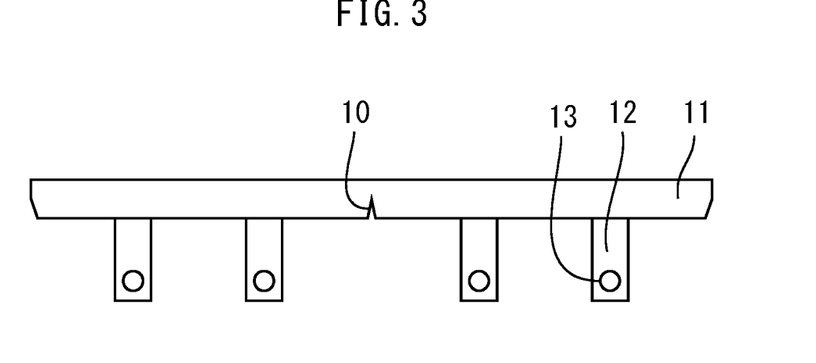
FIG. 3 is a cross-sectional view illustrating the cover according to the first embodiment.
Figure 4:
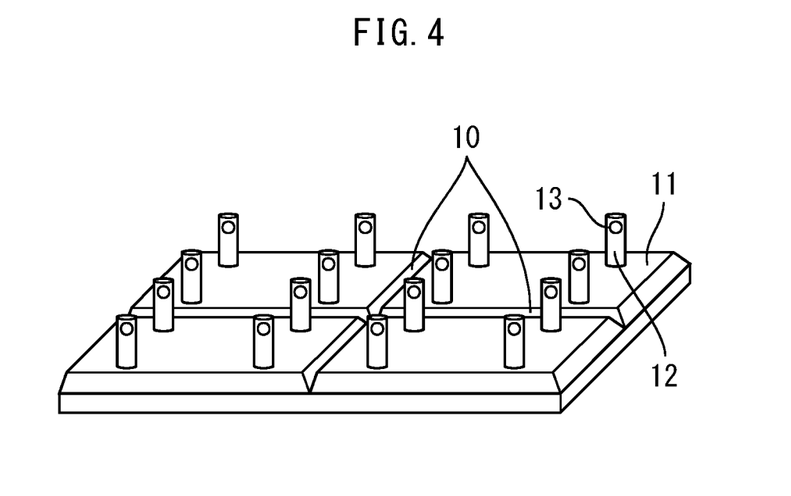
FIG. 4 is a perspective view illustrating the lower surface side of the cover in FIG. 3.
Figure 5:
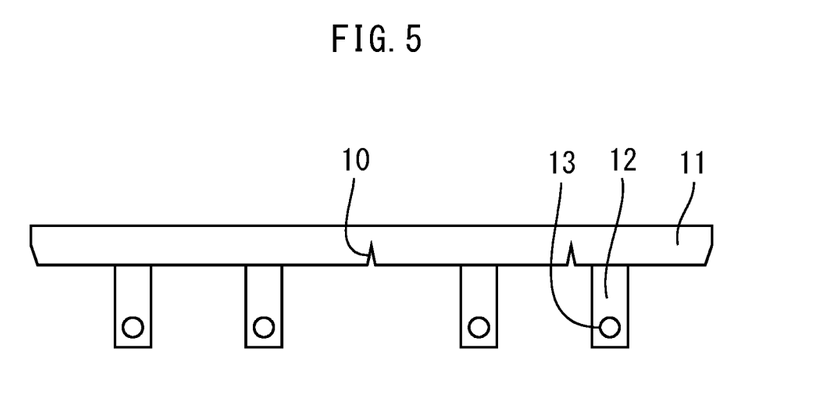
FIG. 5 is a cross-sectional view illustrating the cover according to the first embodiment.
Figure 6:
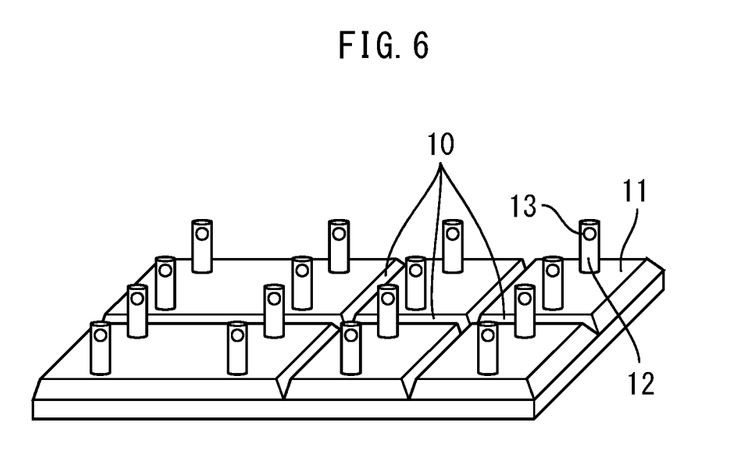
FIG. 6 is a perspective view illustrating the lower surface side of the cover in FIG. 5.

FIG. 2, FIG. 3, and FIG. 5 are cross-sectional views illustrating the cover according to the first embodiment. FIG. 4 is a perspective view illustrating the lower surface side of the cover in FIG. 3. FIG. 6 is a perspective view illustrating the lower surface side of the cover in FIG. 5. In FIG. 2, the grooves 10 are respectively provided at positions between the projections 12. In FIG. 3 and FIG. 4, the grooves 10 are provided in a cross shape on the lower surface of the cover 11. In FIG. 5 and FIG. 6, an interval between the grooves 10 is changed in a lateral direction in the drawings. The grooves 10 are provided in accordance with a lineup of products in like manner. Positions and the number of the projections 12 are also set in accordance with products.

Figure 7:
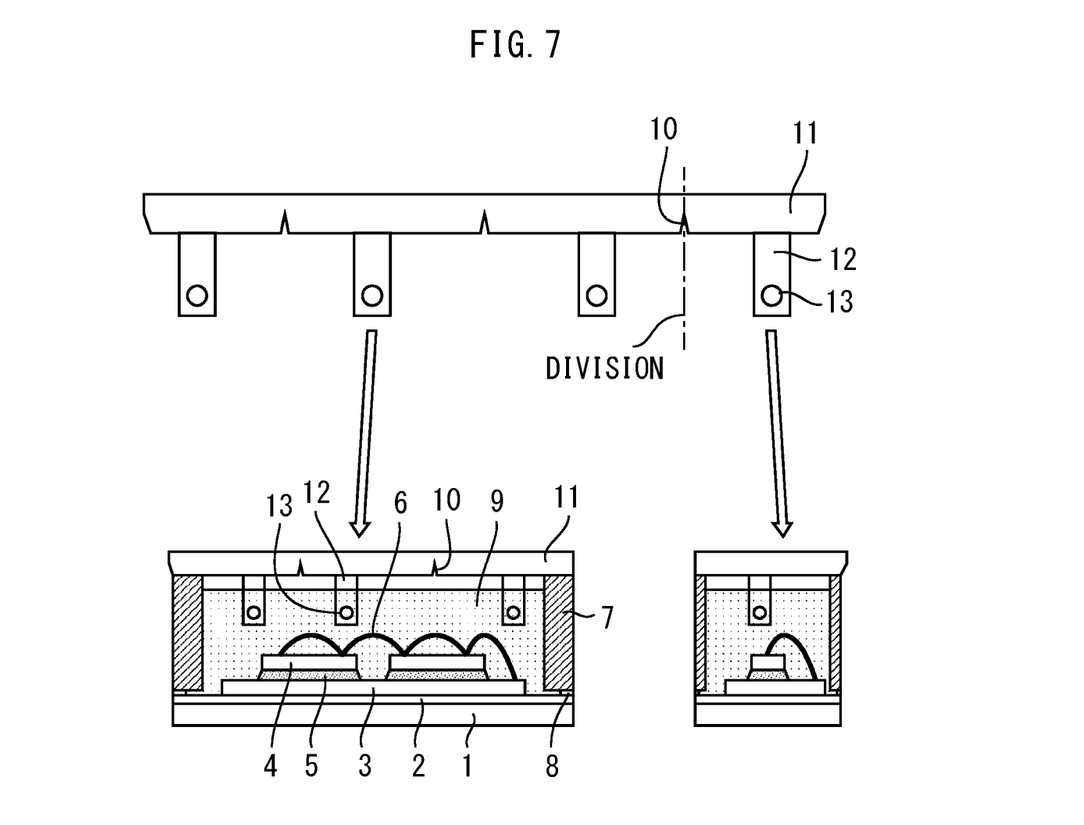
FIG. 7 is a cross-sectional view illustrating a manufacturing method of the semiconductor device according to the first embodiment.

FIG. 7 is a cross-sectional view illustrating a manufacturing method of the semiconductor device according to the first embodiment. First, the semiconductor chip 4 is jointed to the metal pattern 3 on the insulating resin 2. The wire 6 is wire-bonded to the upper electrode of the semiconductor chip 4. The case 7 is bonded to the insulating resin 2 so as to surround the semiconductor chip 4 and so forth. The sealing material 9 is injected inside the case 7 to seal the semiconductor chip 4 and so forth. Note that the case 7 may be bonded to the base plate 1.

In a case where the size of the case 7 is large, the cover 11 is used without being divided along the grooves 10 as illustrated in FIG. 1. Meanwhile, in a case where the size of the case 7 is small, the cover 11 is divided along the grooves 10 in accordance with the size of the case 7, by applying a load to the cover 11, as illustrated in FIG. 7. The cover 11 of a small size which is left after division can be used for cases of other types having a small size, and thus, the cover 11 can be used without waste. It is therefore possible to reduce a production volume of covers 11.

The divided cover 11 is placed on an upper part of the case 7 to cover the semiconductor chip 4 and the sealing material 9. The tip end portions of the projections 12 are inserted into the sealing material 9 before curing. Then, the cover 11 is fixed by the sealing material 9 being cured by heating.

As described above, in the present embodiment, the V-shaped grooves 10 are provided on the cover 11. By dividing the cover 11 along the grooves 10, it is possible to easily adjust the size of the cover 11 in accordance with sizes in a planar direction of the cases 7 of semiconductor devices having different specifications or sizes. Thus, a shape of the cover 11 to be molded is standardized, which eliminates the need for design of molds for a number of types of covers having different sizes, inventory control of a number of types of covers, and resin molding for each types of covers. It is therefore possible to reduce manufacturing cost.

Further, through-holes 13 are provided at the tip end portions of the projections 12 and are sealed with the sealing material 9. Thus, the cover 11 can be easily fixed by the anchor effect, which eliminates the need for an adhesive agent between the cover 11 and the case 7. Note that the cover 11 may be bonded on the upper surface of the case 7 with an adhesive agent or a sealing material. This can sufficiently stably fix the cover 11.

In a case where the projections 12 are bonded on the lower surface of the cover 11, it is difficult to position the projections 12, and there is a possibility that the projections 12 may interfere with parts within the device such as the semiconductor chip 4 and the wire 6. Thus, in the present embodiment, the cover 11 and the projections 12 are integrally molded with a resin such as PPS or PBT.

Second Embodiment

Figure 8:
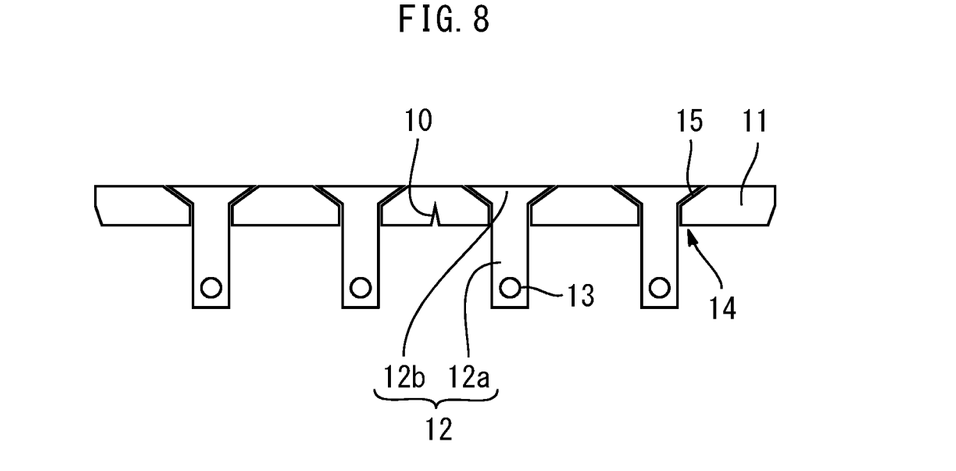
FIG. 8 is a cross-sectional view illustrating a cover according to the second embodiment.

FIG. 8 is a cross-sectional view illustrating a cover according to the second embodiment. In a similar manner to the first embodiment, the V-shaped groove 10 is provided on the cover 11, so that it is possible to easily adjust the size of the cover 11 in accordance with the size of the case 7. It is therefore possible to reduce manufacturing cost.

While the cover 11 and the projections 12 are integrated in the first embodiment, in the present embodiment, the cover 11 and the projections 12 are separate members which are individually molded with a resin and are used in combination with each other. Openings 14 are provided in the cover 11. The opening 14 has a countersink 15 on the upper surface side of the cover 11. The projection 12 has a projection body 12a and a wide portion 12b which is provided at an upper part of the projection body 12a and which has a wider width than the width of the projection body 12a. The countersink 15 and the wide portion 12b have tapered shapes, for example, with the tapered angle of 45°, which correspond to each other.

The projection body 12a is inserted into the opening 14 and projects from the lower surface of the cover 11. The wide portion 12b is fitted with the countersink 15. The tapered shape of the wide portion 12b fits the tapered shape of the countersink 15.

Figure 9:
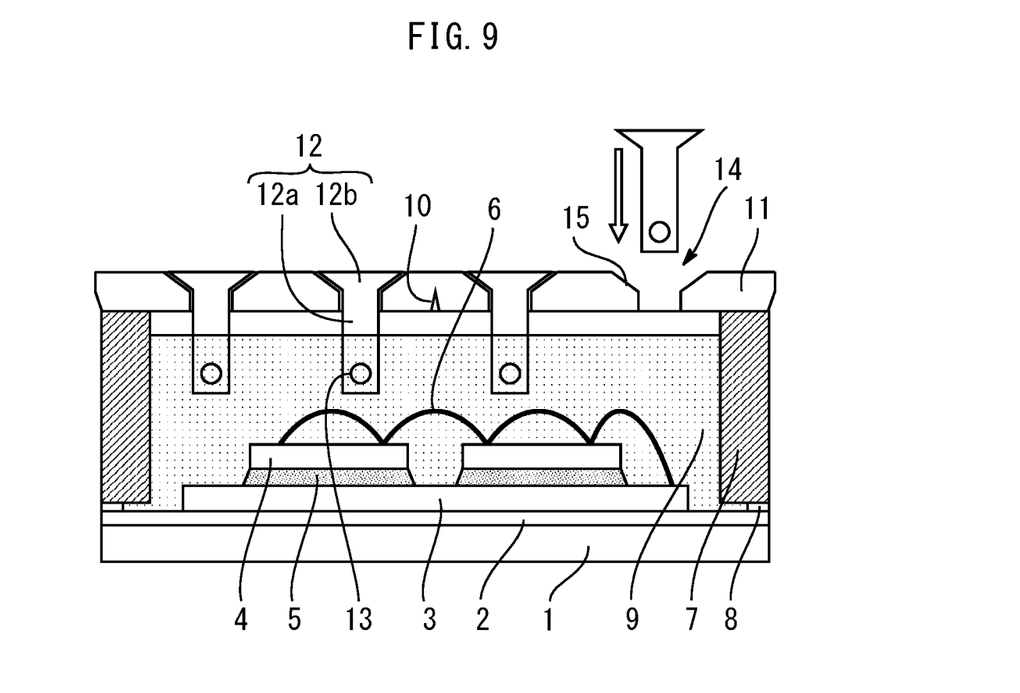
FIG. 9 is a cross-sectional view illustrating the semiconductor device according to the second embodiment.

FIG. 9 is a cross-sectional view illustrating the semiconductor device according to the second embodiment. After the sealing material 9 is injected inside the case 7, the divided cover 11 is placed on the upper part of the case 7 to cover the semiconductor chip 4 and the sealing material 9. The projections 12 are inserted into the openings 14 in the cover 11, and the tip end portions of the projections 12 are inserted into the sealing material 9 before curing. Then, the cover 11 and the projections 12 are fixed by the sealing material 9 being cured. Note that in a case where the projections 12 float and protrude from the cover 11 before the sealing material 9 is cured, a weight may be placed on the projections 12 until the sealing material 9 is cured to prevent floating.

As described above, in the present embodiment, the cover 11 and the projections 12 are separate members which are individually molded with a resin. The cover 11 has a plate shape before the cover 11 is combined with the projections 12, so that a plurality of covers 11 can be stacked. It is therefore possible to reduce space for preparing the cover 11. Work of supplying the projections 12 can be performed in less space using a part feeder, or the like.

Further, the projections 12 can be combined with the cover 11 only by inserting the projections 12 into the openings 14 in the cover 11. Then, it is possible to accurately arrange the projections 12. Further, the wide portions 12b of the projections 12 are fitted with the countersinks 15 of the openings 14 in the cover 11, and the tapered shape of the wide portion 12b fits the tapered shape of the countersink 15. As a result of this, the projections 12 are positioned and prevented from dropping.

Third Embodiment

Figure 10:
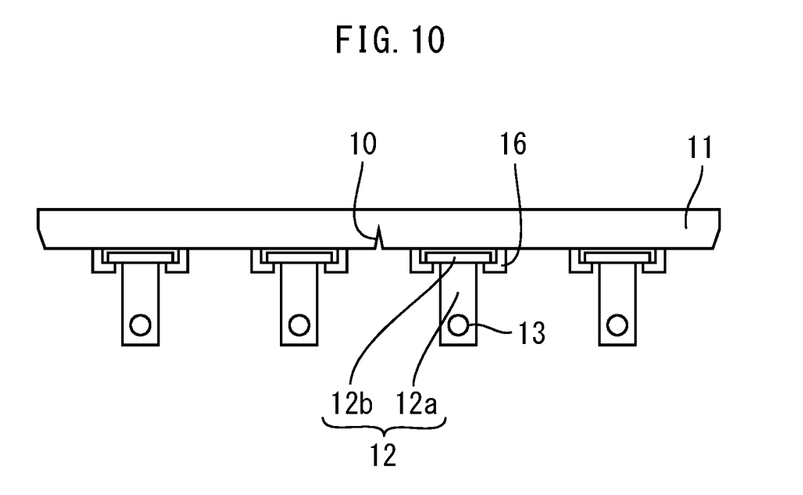
FIG. 10 is a cross-sectional view illustrating a cover according to the third embodiment.
Figure 11:
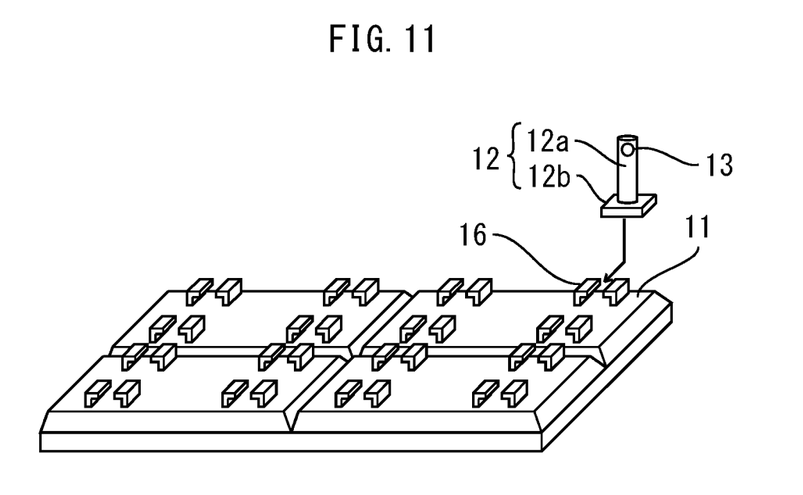
FIG. 11 is a perspective view illustrating the lower surface side of the cover in FIG. 10.

FIG. 10 is a cross-sectional view illustrating a cover according to the third embodiment. FIG. 11 is a perspective view illustrating the lower surface side of the cover in FIG. 10. In a similar manner to the first embodiment, the V-shaped grooves 10 are provided on the cover 11, so that it is possible to easily adjust the size of the cover 11 in accordance with the size of the case 7. It is therefore possible to reduce manufacturing cost.

While the cover 11 and the projections 12 are integrated in the first embodiment, in the present embodiment, the cover 11 and the projections 12 are separate members which are individually molded with a resin and are used in combination with each other. The projection 12 has a projection body 12a and a wide portion 12b which is provided at an upper part of the projection body 12a and which has a wider width than the width of the projection body 12a. Hook-like holding portions 16 which hold the wide portions 12b of the projections 12 are provided on the lower surface of the cover 11. It is possible to prevent dropping of the projections 12 by the wide portions 12b of the projections 12 being held at the holding portions 16.

As described above, in the present embodiment, the cover 11 and the projections 12 are separate members which are individually molded with a resin. The cover 11 has a plate shape before the cover 11 is combined with the projections 12, so that a plurality of covers 11 can be stacked. It is therefore possible to reduce space for preparing the cover 11. Work of supplying the projections 12 can be performed in less space using a part feeder, or the like.

Further, the projections 12 can be combined with the cover 11 only by hooking the wide portions 12b of the projections 12 to the holding portions 16 of the cover 11. Then, it is possible to accurately arrange the projections 12. Further, the projections 12 are provided on the lower surface of the cover 11, which prevents the projections 12 from floating and protruding from the cover 11 due to expansion, or the like, of the sealing material 9 upon sealing. Further, the upper surface of the cover 11 has a flat shape with no opening, and thus, appearance of the cover 11 does not change even if the projections 12 are not provided at all the holding portions 16 of the cover 11. Thus, the projections 12 do not have to be provided at portions where the projections 12 cannot be provided due to limitations of a structure of the semiconductor device, for example. Other configurations and effects are similar to the configurations and the effects in the first and the second embodiments.

In the second and the third embodiments, it is not necessary to make lengths and widths of a plurality of the projections 12 the same, and the lengths and the widths may be changed in accordance with the size or the shape of the device. For example, a length of the projection 12 at a central portion of the case 7 may be shorter than that of the projection 12 at an outer peripheral portion of the case 7 so that the projections 12 do not contact with the semiconductor chip 4 and the wire 6 provided at the central portion of the case 7. It is possible to tightly fix the cover 11 by making the projections 12 longer and deeply inserting the projections 12 into the sealing material 9 at a portion where neither the semiconductor chip 4 nor the wire 6 exists.

Note that the semiconductor chip 4 is not limited to that formed with silicon and may be formed with a wideband gap semiconductor having a greater band gap than the band gap of silicon. The wideband gap semiconductor is, for example, silicon carbide, a gallium nitride material, or diamond. The semiconductor chip formed with such a wideband gap semiconductor has a high withstand voltage and high allowable current density, so that it is possible to make the semiconductor chip smaller. Use of such a semiconductor chip which is made smaller also enables a semiconductor device which incorporates this semiconductor chip to be made smaller and higher integrated. Further, the semiconductor chip has high heat resistance, which allows radiating fins of a heat sink to be made smaller and allows use of air cooling instead of a water cooling portion, so that it is possible to make the semiconductor device further smaller. Further, the semiconductor chip has a low power loss and high efficiency, so that it is possible to increase efficiency of the semiconductor device.

Fourth Embodiment

In this embodiment, the semiconductor devices according to the first to third embodiments described above are applied to a power conversion apparatus. The power conversion apparatus is, for example, an inverter device, a converter device, a servo amplifier, or a power supply unit. Although the present disclosure is not limited to a specific power conversion apparatus, a case where the present disclosure is applied to a three-phase inverter will be described below.

Figure 12:
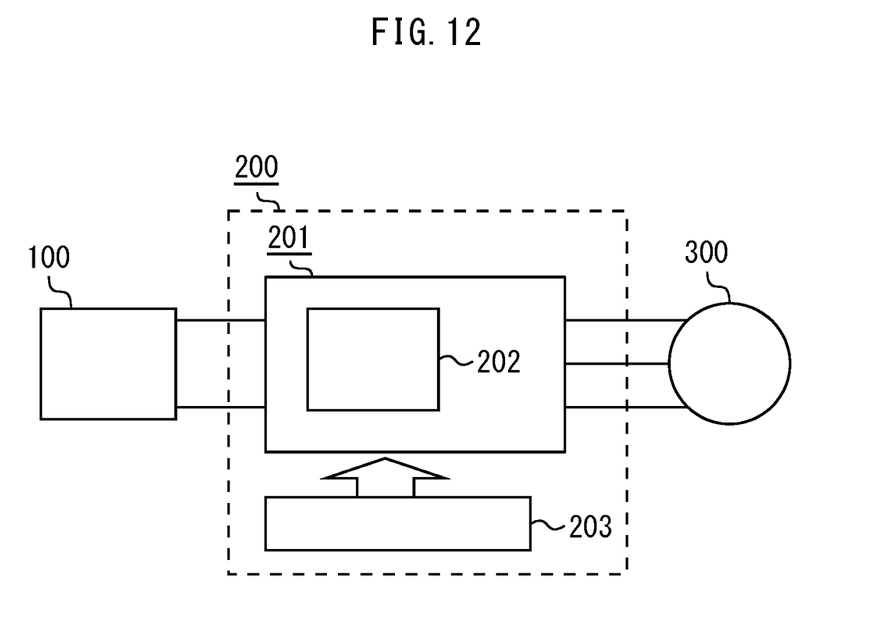
FIG. 12 is a block diagram illustrating a configuration of an electric power conversion system to which the power conversion apparatus according to the fourth embodiment is applied.

FIG. 12 is a block diagram illustrating a configuration of an electric power conversion system to which the power conversion apparatus according to the fourth embodiment is applied. This electric power conversion system includes a power supply 100, an power conversion apparatus 200, and a load 300. The power supply 100 is a DC power supply and supplies DC power to the power conversion apparatus 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The power conversion apparatus 200 is a three-phase inverter connected to a node between the power supply 100 and the load 300, converts DC power supplied from the power supply 100 into AC power, and supplies the AC power to the load 300. The power conversion apparatus 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the power conversion apparatus 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The power conversion apparatus 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to any one of the first to fourth embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the power conversion apparatus according to this embodiment, the semiconductor devices according to the first to third embodiments are applied as the semiconductor device 202. Accordingly, the manufacturing cost of the power conversion apparatus can also be reduced.

While this embodiment illustrates an example in which the present disclosure is applied to a two-level three-phase inverter, the present disclosure is not limited to this and can be applied to various power conversion apparatuses. While this embodiment illustrates a two-level power conversion apparatus, the present disclosure can also be applied to a three-level or multi-level power conversion apparatus. When power is supplied to a single-phase load, the present disclosure may be applied to a single-phase inverter. The present disclosure can also be applied to a DC/DC converter or an AC/DC converter when power is supplied to a DC load or the like.

Further, in the power conversion apparatus to which the present disclosure is applied, the above-mentioned load is not limited to an electric motor. For example, the load may also be used as a power supply device for an electric discharge machine, a laser beam machine, an induction heating cooker, or a non-contact device power feeding system. More alternatively, the power conversion apparatus may be used as a power conditioner for a photovoltaic power generating system, an electricity storage system, or the like.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-042530, filed on Mar. 16, 2021 including specification, claims, drawings and summary, on which the convention priority of the present application is based, is incorporated herein by reference in its entirety.

The invention claimed is:

1. A semiconductor device comprising:
   an insulating resin;
   a metal pattern provided on the insulating resin;
   a semiconductor chip jointed to the metal pattern;
   a case bonded on the insulating resin and surrounding the semiconductor chip;
   a sealing material sealing the semiconductor chip inside the case; and
   a cover provided on an upper part of the case and covering the semiconductor chip and the sealing material, wherein
   a groove having a V-shaped cross-section is provided on the cover, and
   an angle of the V-shaped groove is equal to or less than 90 degrees.

2. The semiconductor device according to claim 1, wherein
   the sealing material includes a thermosetting resin,
   a projection is provided on a lower surface of the cover, and
   a tip end portion of the projection is sealed with the sealing material.

3. The semiconductor device according to claim 2, wherein a through-hole is provided at the tip end portion of the projection.

4. The semiconductor device according to claim 2, wherein the cover and the projection are separate members.

5. The semiconductor device according to claim 4, wherein an opening having a countersink is provided in the cover,
   the projection has a projection body and a wide portion which is provided at an upper part of the projection body and which has a wider width than a width of the projection body,
   the projection body is inserted into the opening and projects from a lower surface of the cover, and
   the wide portion is fitted with the countersink.

6. The semiconductor device according to claim 5, wherein the countersink and the wide portion have tapered shapes which correspond to each other.

7. The semiconductor device according to claim 4, wherein the projection has a projection body and a wide portion which is provided at an upper part of the projection body and which has a wider width than a width of the projection body, and a holding portion which holds the wide portion is provided on a lower surface of the cover.

8. The semiconductor device according to claim 4, wherein the projection includes a plurality of projections having different lengths or different widths.

9. The semiconductor device according to claim 1, wherein the semiconductor chip is made of a wide-band-gap semiconductor.

10. A power conversion apparatus comprising:
a main conversion circuit including the semiconductor device according to claim 1, converting input power and outputting converted power; and
a control circuit outputting a control signal for controlling the main conversion circuit to the main conversion circuit.

11. The semiconductor device according to claim 1, wherein the cover is made of resin.

12. A semiconductor device comprising:
an insulating resin;
a metal pattern provided on the insulating resin;
a semiconductor chip jointed to the metal pattern;
a case bonded on the insulating resin and surrounding the semiconductor chip;
a sealing material sealing the semiconductor chip inside the case; and
a cover provided on an upper part of the case and covering the semiconductor chip and the sealing material, wherein
a groove having a V-shaped cross-section is provided on the cover,
the sealing material includes a thermosetting resin,
a projection is provided on a lower surface of the cover, and
a tip end portion of the projection is sealed with the sealing material.

13. A semiconductor device comprising:
an insulating resin;
a metal pattern provided on the insulating resin;
a semiconductor chip jointed to the metal pattern;
a case bonded on the insulating resin and surrounding the semiconductor chip;
a sealing material sealing the semiconductor chip inside the case; and
a cover provided on an upper part of the case and covering the semiconductor chip and the sealing material, wherein
plural grooves each having a V-shaped cross-section are provided on the cover.

14. A semiconductor device comprising:
an insulating resin;
a metal pattern provided on the insulating resin;
a semiconductor chip jointed to the metal pattern;
a case bonded on the insulating resin and surrounding the semiconductor chip;
a sealing material sealing the semiconductor chip inside the case; and
a cover provided on an upper part of the case and covering the semiconductor chip and the sealing material, wherein
a groove having a V-shaped cross-section is provided on the cover for dividing the cover.

* * * * *